(12) United States Patent
Chen et al.

(10) Patent No.: US 9,570,418 B2
(45) Date of Patent: Feb. 14, 2017

(54) STRUCTURE AND METHOD FOR PACKAGE WARPAGE CONTROL USING DUMMY INTERCONNECTS

(71) Applicant: Taiwan Semiconductor Manufacturing Company, Ltd., Hsin-Chu (TW)

(72) Inventors: Ying-Ju Chen, Tuku Township (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 36 days.

(21) Appl. No.: 14/298,490

(22) Filed: Jun. 6, 2014

(65) Prior Publication Data

US 2015/0357302 A1    Dec. 10, 2015

(51) Int. Cl.
| | |
|---|---|
| *H01L 23/00* | (2006.01) |
| *H01L 25/10* | (2006.01) |
| *H01L 25/00* | (2006.01) |
| *H01L 23/31* | (2006.01) |

(52) U.S. Cl.
CPC ............ *H01L 24/97* (2013.01); *H01L 23/562* (2013.01); *H01L 24/19* (2013.01); *H01L 24/20* (2013.01); *H01L 25/105* (2013.01); *H01L 25/50* (2013.01); *H01L 23/3128* (2013.01); *H01L 24/29* (2013.01); *H01L 24/32* (2013.01); *H01L 24/73* (2013.01); *H01L 24/83* (2013.01); *H01L 24/92* (2013.01); *H01L 2224/04105* (2013.01); *H01L 2224/12105* (2013.01); *H01L 2224/2919* (2013.01); *H01L 2224/32225* (2013.01); *H01L 2224/73267* (2013.01); *H01L 2224/83005* (2013.01); *H01L 2224/92244* (2013.01); *H01L 2224/97* (2013.01); *H01L 2225/1035* (2013.01); *H01L 2225/1041* (2013.01); *H01L 2225/1058* (2013.01); *H01L 2924/13091* (2013.01); *H01L 2924/15311* (2013.01); *H01L 2924/3511* (2013.01)

(58) Field of Classification Search
CPC ...... H01L 24/25; H01L 23/3114; H01L 24/14; H01L 2224/221
USPC ........................................................ 257/775
See application file for complete search history.

(56) References Cited

U.S. PATENT DOCUMENTS

| | | | |
|---|---|---|---|
| 2012/0074580 A1* | 3/2012 | Nalla | H01L 21/568 257/774 |
| 2012/0299167 A1* | 11/2012 | Chen | H01L 23/3114 257/668 |
| 2013/0093077 A1* | 4/2013 | Liang | H01L 23/3192 257/737 |
| 2013/0147033 A1* | 6/2013 | Chen | H01L 23/3114 257/737 |
| 2015/0115465 A1* | 4/2015 | Lin | H01L 24/19 257/774 |

* cited by examiner

*Primary Examiner* — Peter Bradford
(74) *Attorney, Agent, or Firm* — Slater Matsil, LLP

(57) ABSTRACT

Presented herein is a package comprising a molding compound layer and an active device in the molding compound layer. A conductive via passes through the molding compound layer and is adjacent to the active device. A passivation layer is disposed on the molding compound layer. An active PPI is disposed on the passivation layer and is electrically connected to the conductive via. A dummy PPI is disposed on the passivation layer and is electrically isolated from the conductive via and the active device.

20 Claims, 5 Drawing Sheets

STRUCTURE AND METHOD FOR PACKAGE WARPAGE CONTROL USING DUMMY INTERCONNECTS

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. In some devices, multiple dies or packages with active devices or circuits are stacked vertically to reduce the footprint of a device package and permit dies with different processing technologies to be interconnected. Interconnections for this vertical stacking, or for mounting a die or package on a carrier, board or other die, are created by forming redistribution layers (RDLs) with conductive lines in insulating layers. Passivation layers and post-passivation interconnects provide connection between the RDLs and a connector such as a solder ball, stud, bump or the like. The RDLs and passivation layers are frequently formed using back-end-of-line (BEOL) processes after the production of active devices.

BRIEF DESCRIPTION OF THE DRAWINGS

Aspects of the present disclosure are best understood from the following detailed description when read with the accompanying figures. Corresponding numerals and symbols in the different figures generally refer to corresponding parts unless otherwise indicated. The figures are drawn to illustrate the relevant aspects of the embodiments and it should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
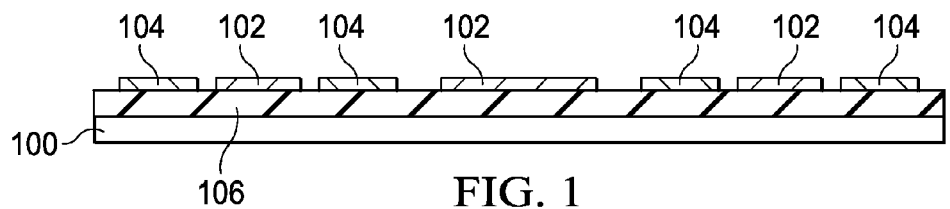
FIGS. 1-8 are cross-sectional views illustrating intermediate steps in a process for forming dummy post-passivation interconnects (PPIs) according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three dimensional integrated circuit (3D IC) packages are commonly formed by stacking one or more devices or dies vertically. These devices are attached by way of connectors such as, for example, a ball grid array (BGA), a land grid arrays (LGA), solder balls, studs, wire bonds, or other conductive connectors. The connectors are disposed on each side of a package to permit connection to adjoining packages on top and bottom of the package. Conductive layers are disposed on both sides of the package to provide connectivity between the connectors and the active devices on the package substrate.

Disclosed herein is a method for forming dummy post-passivation interconnect (PPI) structures over passivation layers on a package. The metal features on a package have a different coefficient of thermal expansion (CTE) than surrounding dielectric or semiconductor material. It has been discovered that a package having a greater density of metal features on one side results in greater overall expansion of the layer or side with the greater density of metal features. This greater expansion causes warping of the package during heat treatment or processing. It has also been discovered that equalizing the density of metal features on opposing sides of a package reduces or prevents warping of a package during heat processing. Embodiments disclosed herein are directed equalizing the density of metal features by providing dummy metal features on the post-passivation layer of a package.

FIG. 1 is a cross-sectional view illustrating formation of dummy PPIs 102 and active PPIs 104 on a protective layer 106 according to an embodiment. The protective layer 106 is formed on a carrier 100 such as a glass carrier or the like and comprises an insulating or dielectric material such as a polyimide, polymer, epoxy, plastic or another insulating material. In an embodiment, the protective layer 106 is formed as a contiguous layer. For example, in some embodiments, the protective layer 106 is formed from a molded liquid such as polybenzyloxalate (PBO) that is applied to a carrier and retained by a mold or lip on the carrier until cured. In an embodiment, the protective layer 106 is modified in subsequent steps (See, e.g., FIG. 7) to have one or more openings.

Active PPIs 104 and dummy PPIs 102 are formed on the protective layer 106. In an embodiment, the active PPIs 104 and dummy PPIs 102 are copper (Cu), but in other embodiments, are polysilicon, gold (Au), aluminum (Al), tantalum (Ta), tungsten (W), aluminum-copper alloy (AlCu) or any other suitable conductive material, alloy or compound. In an embodiment, active PPIs 104 and dummy PPIs 102 are formed using deposition processes such as chemical vapor deposition (CVD); plasma enhanced chemical vapor deposition (PECVD), physical vapor deposition (PVD), or another deposition process. The active PPIs 104 and dummy PPIs 102 are, in some examples, formed in a single process step from a metal or other conductive material that is formed as a blanket layer and subsequently etched. For example, copper active PPIs 104 and dummy PPIs 102 are formed by depositing a copper blanket layer over the protective layer 106. A photolithographic mask is the formed over the blanket copper layer, and the copper blanket layer is etched. The areas under the mask remain after the etching, leaving the active PPIs 104 and dummy PPIs 102. In other embodiments, a copper blanket layer is formed, and the active PPIs 104 and dummy PPIs 102 formed by mechanically milling, ion milling, or the like. In some embodiments, a damascene process is used, where the protective layer 106 is patterned to create trenches or recesses in the protective layer 106 surface. A metal layer is deposited and then planarized to remove excess material, leaving the active PPIs 104 and dummy PPIs 102 in the recesses in the protective layer 106. In other embodiments, the active PPIs 104 and dummy PPIs 102 are formed from a deposition process that forms the structures without requiring etching or other material removal, such as printing with conductive ink or a like process.

In some embodiments, the dummy PPIs 102 are the same material as the active PPIs 104, and are formed in a same process step. In other embodiments, the dummy PPIs 102 and the active PPIs 104 are formed in different process steps, or are formed from different materials. For example, where the active PPIs 104 are copper, the dummy PPIs 102 may be aluminum, tungsten, an alloy or another metal.

Figure 2:
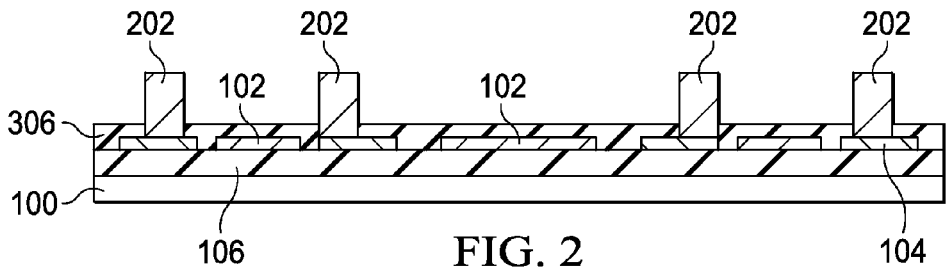

FIG. 2 is a cross-sectional view illustrating formation of a passivation layer 306 and vias 202 according to an embodiment. In some embodiments, one or more back side passivation layers 306 are formed over the dummy PPIs 102 and the active PPIs 104. The backside passivation layer 306 is formed from an insulating material such as a nitride, an oxynitride, an oxide, a carbide, a polymer, a polyimide, or another material and provides physical and chemical protection and electrical insulation for subsequently formed layers. The backside passivation layer 306 electrically isolates the dummy PPIs 102 in conjunction with the protective layer 106. The backside passivation layer 306 is formed by for example, molding a liquid or gel polymer, or by a deposition process such as PVD, CVD, PECVD or another deposition process. In some embodiments, one or more through vias 202 are formed on the active PPIs 104 through the passivation layer 306 to provide electrical connectivity to subsequently formed structures. The through vias 202 are formed by patterning a mask, plating openings in the mask with a metal or otherwise depositing a conductive material in the openings, and removing the mask to leave the through vias 202. In other embodiments, the through vias 202 are formed using a wirebonder creating the through vias 202 from an upright wirebonded wire, through placement of a pre-formed rigid structure, or another formation process. Additionally, in some embodiments, a back side redistribution layer (RDL) (not shown) is formed over the backside passivation layer 306. In such embodiments, the back side RDL comprises metal features disposed in one or more dielectric layers. In some embodiments, the back side RDL comprises metal features such as vias and traces formed by a damascene or dual damascene process. In such a process, a conductive material is plated into openings etched into an individual dielectric layer. Subsequent dielectric layers are subsequently formed over the plated metal features. In this manner, the backside RDL is constructed layer by layer over the passivation layer 306.

Figure 3:
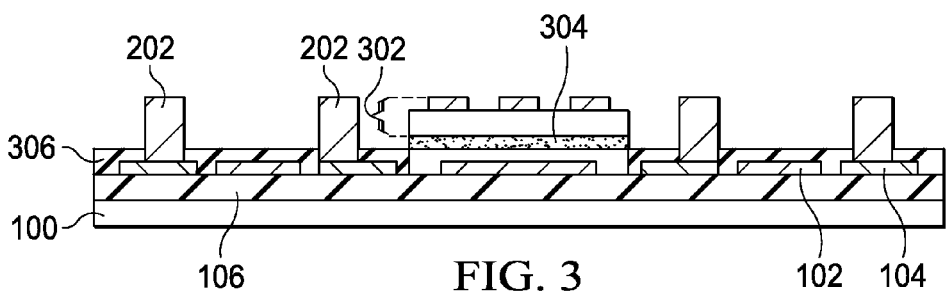

FIG. 3 is a cross-sectional view illustrating mounting of an active device 302 according to some embodiments. An active device 302 is mounted on the passivation layer 306, or where used, the back side RDL. In some embodiments, the active device 302 is a die, chip, package or the like, and has one or more transistors or devices such as MOSFETs, FinFETs, capacitors, or another active device, or has a circuit comprising one or more active devices or another circuit element. The active device 302 is attached to passivation layer 306 using a die attachment film 304, adhesive, heat transfer film, or the like.

Figure 4:
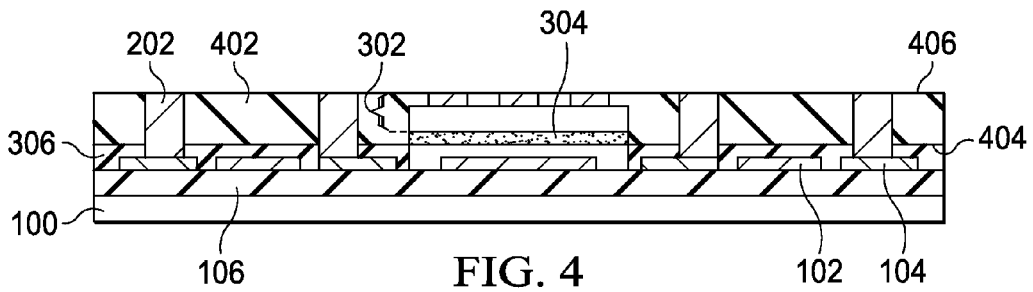

FIG. 4 is a cross-sectional view illustrating formation of a molding compound layer 402 according to some embodiments. The molding compound layer 402 has the active device 302 embedded therein according to some embodiments. The molding compound layer 402 fills gaps between the through vias 202, and fills the gaps between the active device 302 and the through vias 202.

The vias 202 extend through the front side 406 of the molding compound layer 402 to permit connection of subsequently formed features. Additionally, contacts of the active device 302 are exposed at the front side 406 of the molding compound layer 402. In some embodiments, the vias 202 and the contacts of the active device 302 are exposed by planarizing the molding compound layer 402, through, for example, a chemical-mechanical polish (CMP), etch, or the like. The resulting front side 406 surface of the molding compound layer 402 is then substantially coplanar with the vias 202, and in some embodiments, is also substantially coplanar with the contacts or connectors of the active device 302.

Figure 5:
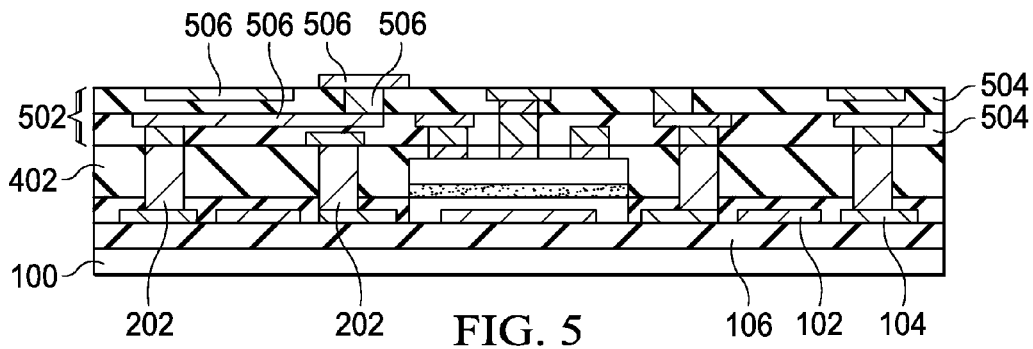

FIG. 5 is a cross-section view illustrating formation of a front side RDL 502 on the front side 406 of the molding compound layer 402 according to an embodiment. The front side RDL 502 comprises one or more dielectric layers 504 that are a dielectric or high-k dielectric such as, for example, an oxide such as silicon dioxide, a nitride such as silicon nitride, a carbide such as silicon carbide, a polymer, a polyimide or another dielectric material. The front side RDL 502 also comprises metal features 506 disposed in the dielectric layers 504, formed though, for example, a damascene or dual damascene process. The metal features 506 provide electrical connections between the active device 302, to the backside 404 by way of the through vias 202, or to the front side of the front side RDL 502. For example, where the active device 302 has one or more lands, contacts, or other connectors, the front side RDL 502 provides electrical connections between the active device 302 and the through vias 202, other structures in the package or to an external device. One or more portions of the metal features 506 are exposed at the front side surface of the front side RDL 502 to permit electrical contact with subsequently mounted conductive features.

Figure 6:
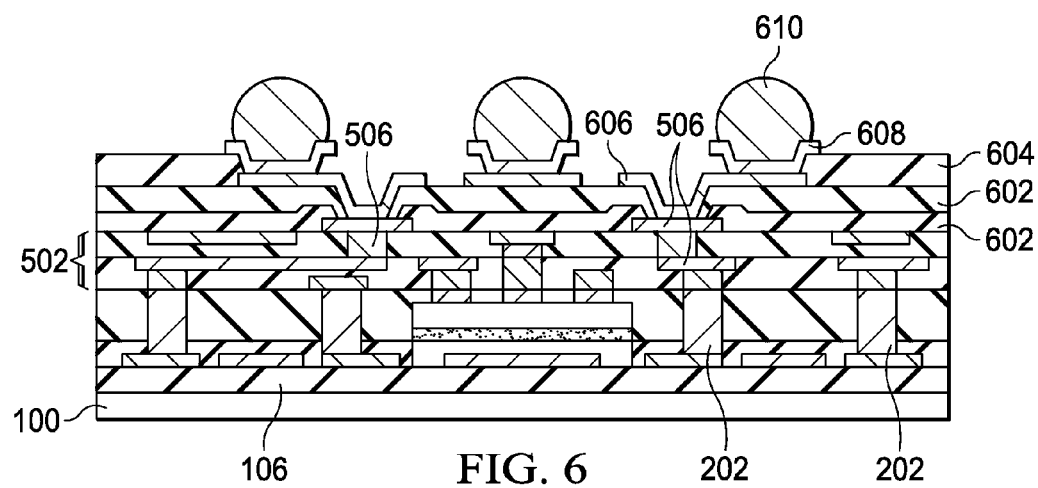

FIG. 6 is a cross-sectional view illustrating formation of front side PPIs 606 and connectors 610 on the front side of the molding compound layer 402 according to an embodiment. In some embodiments, package has one or more finishing layers such as, for example, front side passivation layers 602, insulating layers or a front side protective layer 604. The front side PPIs 606 extend though openings in the front side passivation layer 602 to contact the metal features 506. In some embodiments, the front side PPIs 606 extend horizontally from the contact point with the metal features 506 over the passivation layers 602. In an embodiment, the front side PPI 606 is copper (Cu), but may in other embodiments, may be polysilicon, gold (Au), aluminum (Al), tantalum (Ta), tungsten (W), or any other suitable conductive material or compound. In an embodiment, a copper front side PPI 606 is formed using photolithography and deposition processes such as CVD, PECVD, PVD, or another deposition process.

In some embodiments such as a 3-mask or 4-mask production system, a front side protective layer 604 is formed over the front side PPIs 606 and comprises an insulating or dielectric material such as a polyimide, polymer, epoxy, plastic or another insulating material. The front side protective layer 604 is, for example, formed by masking and deposition, molding, etching or otherwise creating openings that expose portions of the front side PPIs 606 through the front side protective layer 604. Additionally, in a 4-mask production system, one or more lands 608 are formed over the front side protective layer 604. In some embodiments, the lands 608 are under-bump metallization (UBM) structures that are plated, deposited or otherwise formed in the openings in the front side protective layer 604. In other embodiments, the lands 608 are pads disposed over the top surface of the front side protective layer 604 and are connected directly to the front side PPI 606 or indirectly by a via or another conductive element. The lands 608 are configured to accept a connector, 610 providing electrical and signal connectivity between an external device such as a package or die and the active device 302 or the though vias 202 through the front side PPIs 606 and the first RDL 502. The connectors 610 are formed on the lands 608 to permit mounting of the package on a carrier, PCB, wafer, die or the like. In some embodiments, the connectors are solder balls, conductive bumps, studs or the like.

The dummy PPIs 102 are electrically isolated from other conductive features, while the active PPIs 104 contact subsequently formed conductive features. The dummy PPIs 102 increase metal density in the PPI layer when considering the ratio of the surface area of a region covered or filled by metal features to the surface area of the dummy region. The dummy PPIs 102 disposed on the back side 404 of the molding compound layer 402 balance out the density of the metal elements on the front side 406 of the molding compound layer 402. In some embodiments, the dummy PPIs 102 have a density sufficient to bring the total metal density in a dummy region to about 50% or greater. It has been discovered that, during heat processing of a package, the increased metal density provided by the dummy PPIs 102 in combination with the active PPIs 104 equalizes the amount of metal expanding on the backside 404 of the molding compound layer 402 with the amount of metal expanding on the front side 406 of the molding compound layer 402. It should be understood that the dummy PPIs 102 are not limited to being located on a front side or a back side of a molding compound layer 402, package, substrate or device, and may be formed on any side of a molding compound layer 402 to counteract a higher metal density on the opposite side of the target structure.

Metals, such as those used to form the PPIs 606, 102, 104 and metal features 506, generally have a greater CTE than the dielectric or non-metallic materials forming the RDLs 502, passivation layers 602, 306 and protective layers 604, 106. Raising the metal density on a particular side causes the overall CTE for a particular side of the molding compound layer 402 to be dominated by the CTE of the metals. For example, copper has a linear CTE of about $16.6\times10^{-6}/^\circ$ K. That results in a copper element expanding by about 0.00000166% for each degree Kelvin the temperate of the element is raised. In contrast, aluminum has a CTE of about $23.1\times10^{-6}/^\circ$ K, silicon a CTE of about $2.6\times10^{-6}/^\circ$ K and silicon dioxide a CTE of about $0.5\times10^{-6}/^\circ$ K. The higher metal CTEs result in greater expansion under heating and warping of a package when on side has significantly more metal than another side. Providing a metal density greater than about 50% results in the overall CTE being closer to the CTE of copper, aluminum, or another metal used in the dummy region.

The dummy PPIs 102 may be located in a location selected to more effectively control warping of the substrate or molding compound layer 402 during heat processing. It has been discovered that limiting the dummy PPIs 102 to the border regions of a substrate or molding compound layer 402, or to the corner regions of a substrate or molding compound layer 402, provides the unexpected result of reducing or eliminating molding compound layer 402 warping during heat processing without requiring that the metal density on opposing side of the device be precisely matched. Additionally, using a different material for the dummy PPIs 102 than for the active PPIs 104 permits finer tuning of the warping control, and permits use of smaller or fewer dummy PPIs 102. For example, in some embodiments, the dummy PPIs 102 are aluminum while the active PPIs 104 and front side PPI 606 are copper. The aluminum, having a higher CTE than copper, will raise the average CTE of a package side with a lower metal density, permitting the average CTE to be raised with less dummy PPI 102 surface area.

Figure 7:
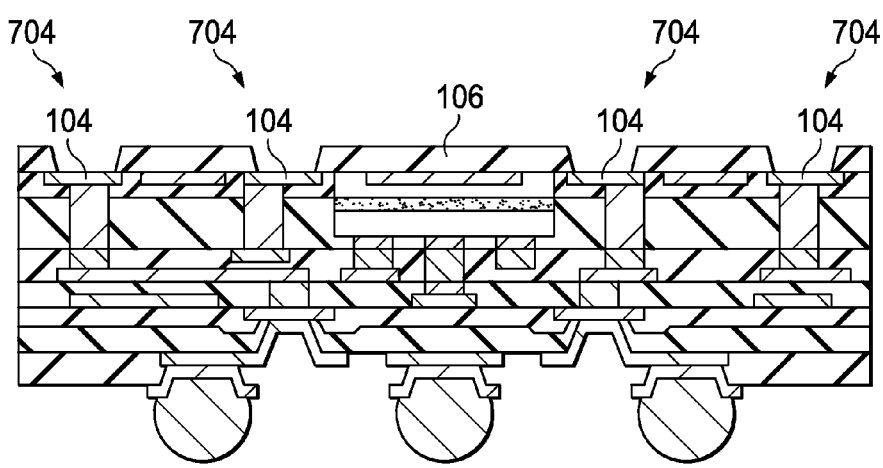

FIG. 7 is a cross-sectional view illustrating forming openings 704 in the protective layer 106 according to an embodiment. In an embodiment, the carrier 100 is removed, and then the protective layer 106 is patterned to form openings 704 exposing the portions of the active PPIs 204 by laser drilling, masking and etching, or another process. After forming the openings, the dummy PPIs 102 remain electrically isolated by the passivation layer 306 and protective layer 106.

Figure 8:
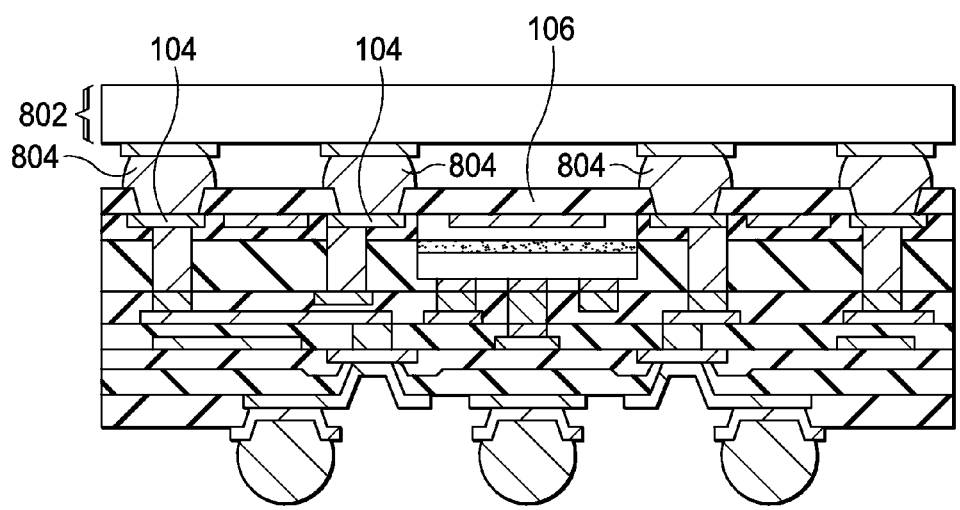

FIG. 8 is a cross-sectional view illustrating mounting a top package 802 on the active PPIs 104 according to an embodiment. The top package 802 is mounted on the active PPIs 104 by way of connectors 804 such as solder balls, conductive bumps, metal pillars, studs or another conductive structure. Additionally, in some embodiments, after mounting the top package 802 the package is singulated for subsequent mounting on another package, carrier, die, PCB or the like. In other embodiments, the package is singulated prior to mounting the top package.

Figure 9A:
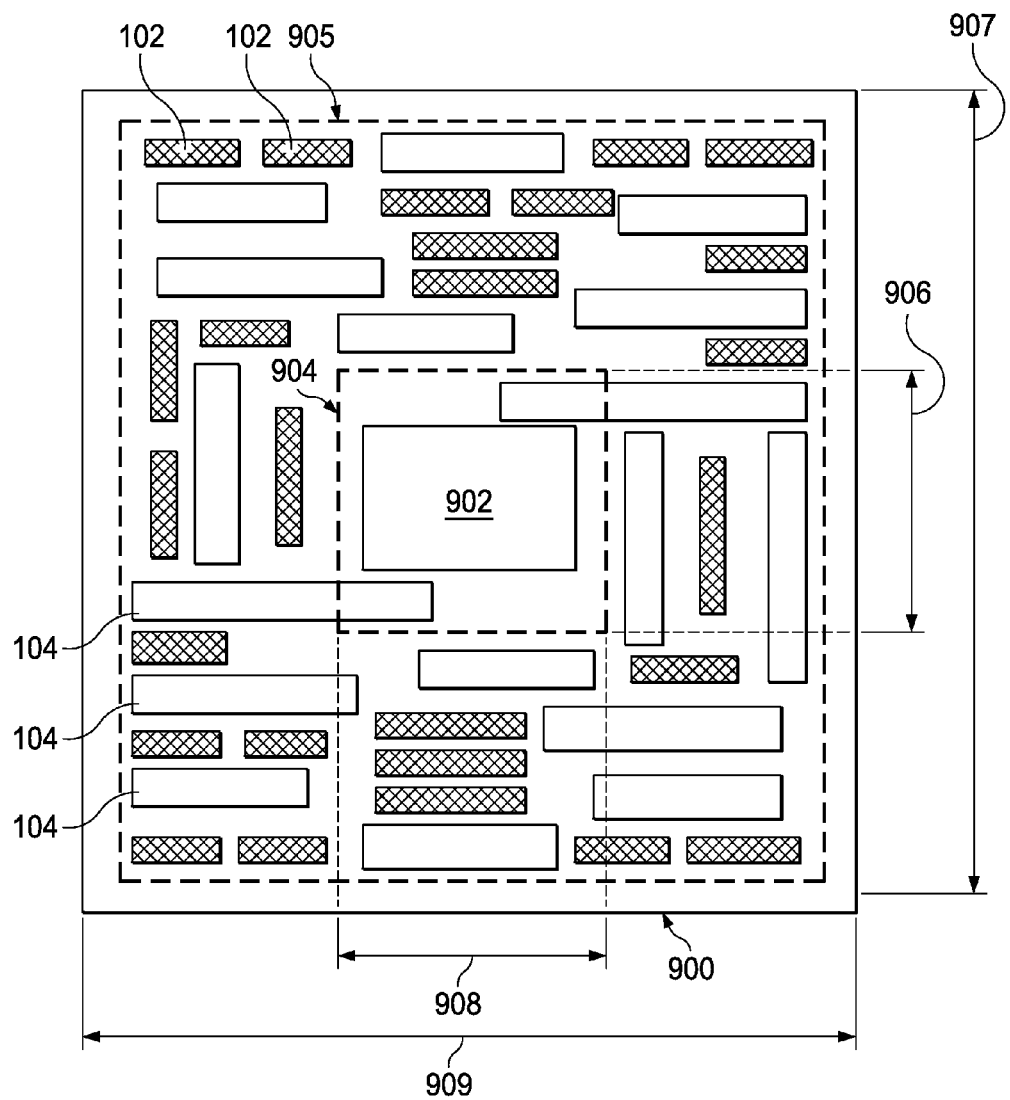
FIGS. 9A-9B are diagrams illustrating top views of arrangements of active PPIs and dummy PPIs according to some embodiments.

FIG. 9A is a diagram illustrating a top view of an arrangement of active PPIs 104 and dummy PPIs 102 in regions 904 and 905 according to some embodiments. In FIG. 9A, the dummy PPIs 102 are illustrated as cross-hatched. The package 900 includes a first region 904 and a second region 905 surrounding the first region 904. A die or active device 902 is disposed in the first region 904. In some embodiments, the first region 904 is a center region of the package 900. The second region 905 has one or more dummy PPIs 102 and active PPIs 104 disposed therein. The dummy PPIs 102 are limited to being in the second region 905 and in some embodiments, are formed outside of the first region 904. The active PPIs 104 are disposed in the second region 905, and in some embodiments, one or more of the active PPIs 104 have portions extending into, or are disposed in, the first region 904. The density of the surface areas of the dummy PPIs 102 and the active PPIs 104 within the second region 905 is about 50% or greater of the area of the second region 905. The second region 905 has a width 909 and a length 907 that is about the same as the width and length of the package 900 since the second region 905 in the embodiment illustrated in FIG. 9A coincides with the package 900 surface and the package region. It has been discovered that a width 908 and length 906 for the first region 904 that is about ⅓ or less of the width 909 and length 907, respectively, of the second region 905 or package 900 provides control of package warping. Thus, in these embodiments, the area of the first region 904 is about ⅑ or less, or about 11% or less, of the surface area of the package 900 or package region. The remaining package 900 surface area or package region, that is, about 89% or more of the package 900 surface area or package region, is comprised of the second region 905.

Figure 9B:
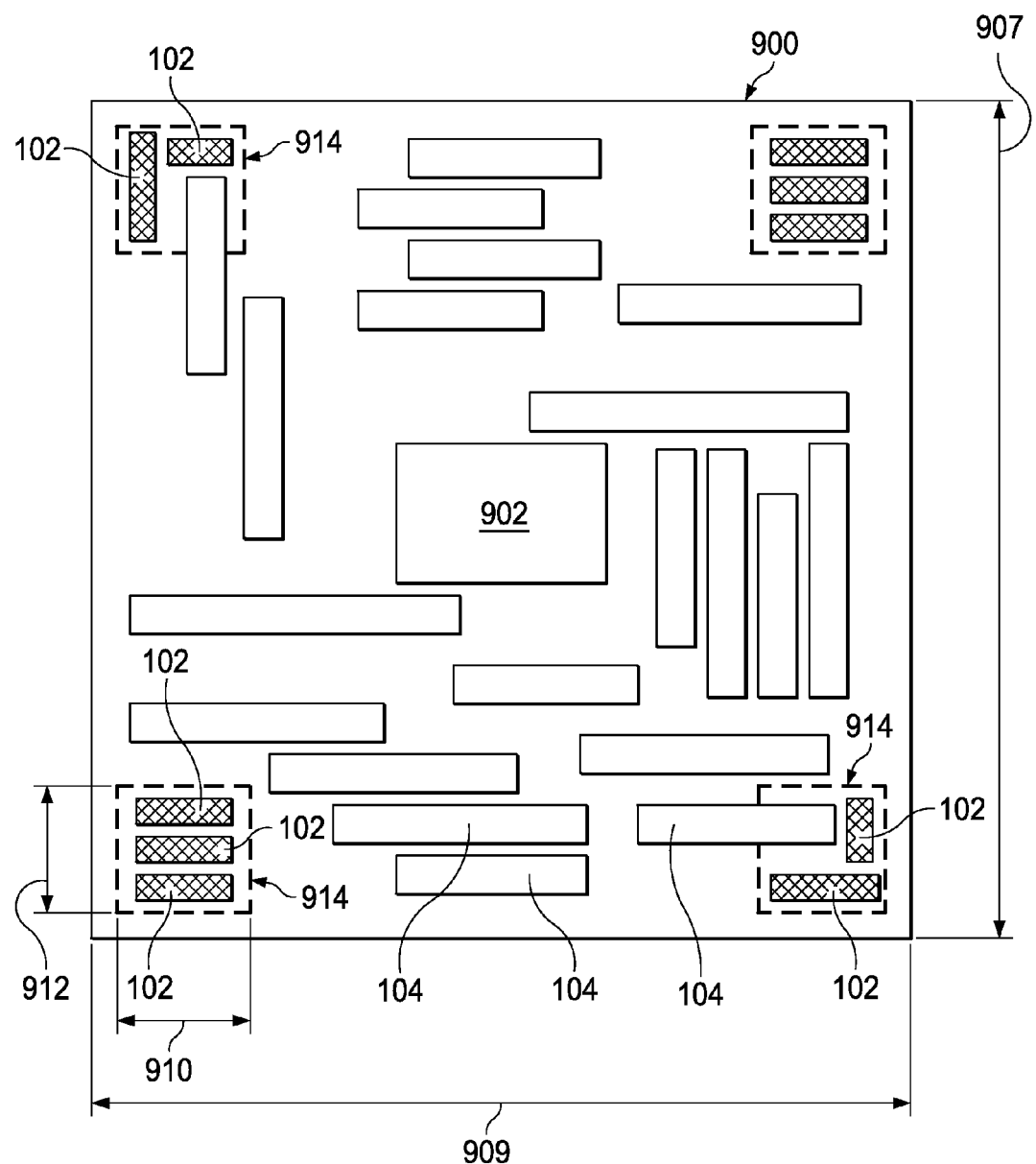

FIG. 9B is a diagram illustrating a top view of an arrangement of active PPIs 104 and dummy PPIs 102 in corner regions 914 according to some embodiments. In FIG. 9B, the dummy PPIs 102 are illustrated as crosshatched.

In some embodiments, the corner regions 914 are disposed in the second region 905 and disposed in the corners of the package 900 immediately adjacent to the package edges, and without any metal features between the corner region 914 and the immediately adjacent package edges. The dummy PPIs 102 are limited to being in the corner regions 914. In some embodiments, one or more corner regions 914 have at least a portion of one or more active PPIs 104 disposed therein. The density of the surface areas of the dummy PPIs 102 and the active PPIs 104 within the corner regions 914 in total is about 50% or greater of the overall area of the corner regions 914. It has been discovered that a width 910 and a length 912 for each corner region 914 that is about ⅙ or less of the width 909 and length 907, respectively, of the package 900 provides control of package warping. Thus, in these embodiments, the total area of the corner regions 914 is about ⅑ or less, or 11% or less, of the surface area of the package 900. The remaining package 900 surface area, or about 89% of the package surface area, is substantially free of dummy PPIs 102.

Figure 10A:
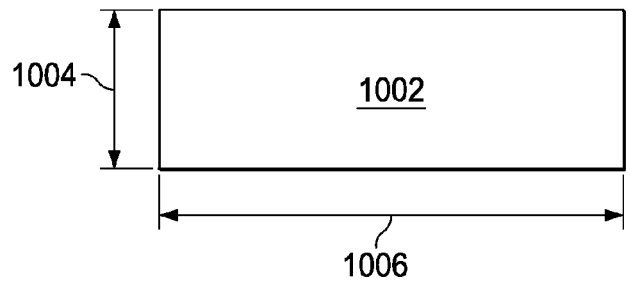
FIGS. 10A-10C are diagrams illustrating dummy PPIs shapes according to various embodiments.
Figure 10B:
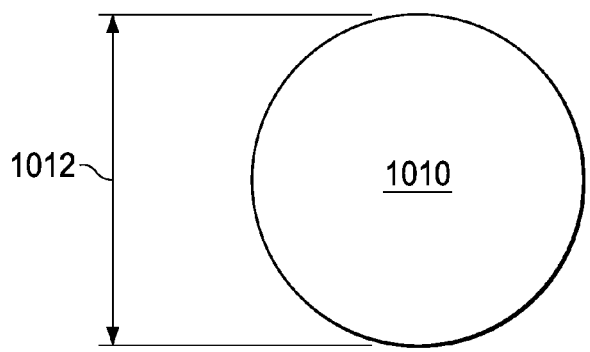
Figure 10C:
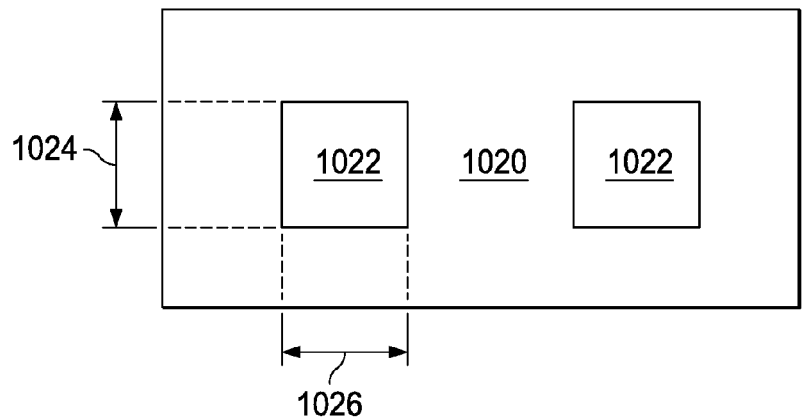

FIGS. 10A-10C are diagrams illustrating top views of different dummy PPI shapes according to various embodiments. It should be understood that the shape of the dummy PPIs 102 disclosed herein are merely exemplary and are not intended to be limiting.

FIG. 10A illustrates a top view of a rectangular dummy PPI 1002 according to some embodiments. In such an embodiment, the rectangular dummy PPI 1002 has substantially straight sides. Additionally, it has been discovered that a length 1006 and length 1004 for the rectangular dummy PPI 1002 that are each about 2 μm or greater results in sufficient size to provide expansion of the dummy PPI that effectively controls package warping.

FIG. 10B illustrates a top view of a circular dummy PPI 1010 according to some embodiments. In such an embodiment, the circular dummy PPI 1010 has curved sides. Additionally, it has been discovered that a diameter 1012 for the circular dummy PPI 1010 that is about 2 μm or greater results in sufficient size to provide expansion of the dummy PPI that effectively controls package warping.

FIG. 10C illustrates a top view of a polygon dummy PPI 1020 according to some embodiments. In such an embodiment, the polygon dummy PPI 1002 has one or more openings or voids that are free of metallic material. It has been discovered that a length 1026 and length 1024 for each of the openings that are each about 2 μm or greater results in a polygon dummy PPI 1020 with sufficient size to provide expansion of the dummy PPI that effectively controls package warping.

Thus, according to an embodiment, a package comprises a molding compound layer and active device in the molding compound layer. A conductive via passes through the molding compound layer and is adjacent to the active device. A passivation layer is disposed on the molding compound layer. An active PPI is disposed on the passivation layer and is electrically connected to the conductive via. A dummy PPI is disposed on the passivation layer and is electrically isolated from the conductive via and the active device. A protective layer overlies the passivation layer and has an opening exposing a portion of the active PPI. A connector is disposed in the opening of the protective layer and is electrically connected to the active PPI. Another package overlies and is electrically connected to the connector. In some embodiments, the connector comprises a solder bump. A dielectric layer underlies the molding compound layer and a metal feature is disposed in the dielectric layer. The metal feature is electrically connected to at least one of the conductive via and the active device. The dummy PPI is electrically isolated from the metal feature. A connector is disposed on the dielectric layer and is electrically connected to the metal feature. In an embodiment, the active PPI is disposed under the active device.

A package according to an embodiment comprises a chip disposed in a first region of the package and embedded in a molding compound layer. A plurality of conductive vias are disposed in a second region of the package and pass through the molding compound layer. The second region surrounds the first region. A plurality of active PPIs are disposed in the second region of the package and are electrically connected to at least one of the plurality of conductive vias. A plurality of dummy PPIs are disposed in the second region of the package and outside of the first region. The plurality of dummy PPIs are electrically isolated from the plurality of conductive vias, the plurality of active PPIs and the chip. A density of a surface area within the second region of the plurality of active PPIs and the plurality of dummy PPIs is about 50% or greater of a total area of the second region. In some embodiments, the first region is in a center region of the package, and wherein the first region has a length that is about ⅓ or less of a length of the package, and has a width that is about ⅓ or less of a width of the package. In some embodiments, the second region has a length that is about ⅙ or less of a length of the package, and has a width that is about ⅙ or less of the width of the package. In some embodiments, the second region is a corner region.

A method of forming a package according to an embodiment comprises forming a protective layer in a first region and a second region of the package and forming an active PPI on the protective layer on the second region. A dummy PPI is formed on the protective layer in the second region, and the dummy PPI is electrically isolated from the active PPI. A conductive via is formed on the active PPI and a chip is attached over the protective layer in the first region. A molding compound layer is formed to cover the protective layer, the active PPI, the dummy PPI, the conductive via and the chip. The conductive via extends through the molding compound layer. An opening is formed in the protective layer to expose the active PPI. A solder bump is formed and is electrically connected to the active PPI through the opening. In some embodiments, another package is mounted to the solder bump. A dielectric layer is formed on the molding compound layer and a metal feature in the dielectric layer, and the metal feature is electrically connected to the conductive via. In some embodiments, a solder bump is formed overlying the dielectric layer and electrically connected to the metal feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a molding compound layer;
an active device in the molding compound layer;
a conductive via passing entirely through the molding compound layer and adjacent to the active device;
a passivation layer adjacent to a first side of the molding compound layer;
an active interconnect on the passivation layer and electrically connected to the conductive via; and
a dummy interconnect on the passivation layer and electrically isolated from the conductive via and the active device, wherein the active interconnect is a different material than the dummy interconnect.

2. The package of claim 1, further comprising a protective layer overlying the passivation layer and having an opening exposing a portion of the active interconnect.

3. The package of claim 2, further comprising a connector in the opening of the protective layer and electrically connected to the first active interconnect.

4. The package of claim 3, further comprising another package overlying and electrically connected to the connector.

5. The package of claim 4, wherein the connector comprises a solder bump.

6. The package of claim 1, further comprising:
a dielectric layer underlying the molding compound layer; and
a metal feature in the dielectric layer; and
wherein the metal feature is electrically connected to at least one of the conductive via and the active device.

7. The package of claim 6, wherein the dummy interconnect is electrically isolated from the metal feature.

8. The package of claim 6, further comprising a connector on the dielectric layer and electrically connected to the metal feature.

9. The package of claim 1, wherein the active interconnect is disposed over the active device.

10. A package, comprising:
a chip disposed in a first region of the package and embedded in a molding compound layer;
a plurality of conductive vias in a second region of the package and passing through the molding compound layer, wherein the second region surrounds the first region;
a first plurality of active interconnects disposed in the second region of the package and electrically connected to at least one of the plurality of conductive vias;
a second plurality of active interconnects partially disposed in the second region of the package and partially disposed in the first region of the package and electrically connected to at least another of the plurality of conductive vias; and
a plurality of dummy interconnects disposed only in the second region of the package, wherein the plurality of dummy interconnects are electrically isolated from the plurality of conductive vias, the plurality of active interconnects and the chip.

11. The package of claim 10, wherein a density of a surface area within the second region of the first plurality of active interconnects, the second plurality of active interconnects and the plurality of dummy interconnects is about 50% or greater of a total area of the second region.

12. The package of claim 10, wherein the first region is in a center region of the package, and wherein the first region has a length that is about ⅓ of a length of the package, and has a width that is about ⅓ of a width of the package.

13. The package of claim 10, wherein the second region has a length that is about ⅙ or less of a length of the package, and has a width that is about ⅙ or less of the width of the package.

14. The package of claim 10 further comprising corner regions located in the second region, wherein the dummy interconnects are disposed only in the corner regions, and wherein the corner regions are 11 percent or less of a combined surface area of the first and second regions.

15. A method of forming a package, comprising:
forming a protective layer in a first region and a second region of the package;
forming an active interconnect on the protective layer on the second region;
forming a dummy interconnect on the protective layer in the second region, wherein the dummy interconnect is electrically isolated from the active interconnect;
forming a conductive via on the active interconnect;
attaching a chip over the protective layer in the first region, the first region being free of the dummy interconnect; and
forming a molding compound layer covering the protective layer, the active interconnect, the dummy interconnect, the conductive via and the chip, wherein the conductive via extends through the molding compound layer.

16. The method of claim 15, further comprising forming an opening in the protective layer to expose the active interconnect.

17. The method of claim 16, further comprising forming a solder bump electrically connected to the active interconnect through the opening.

18. The method of claim 17, further comprising mounting another package to the solder bump.

19. The method of claim 16, further comprising forming a dielectric layer on the molding compound layer and a metal feature in the dielectric layer, wherein the metal feature is electrically connected to the conductive via.

20. The method of claim 19, further comprising forming a solder bump overlying the dielectric layer and electrically connected to the metal feature.

* * * * *